United States Patent [19]

Trumpp

[11] Patent Number: 4,837,778
[45] Date of Patent: Jun. 6, 1989

[54] CIRCUIT ARRANGEMENT FOR TIME-REGENERATION OF BROADBAND DIGITAL SIGNALS

[75] Inventor: Gerhard Trumpp, Puchheim, Fed. Rep. of Germany

[73] Assignee: Siemens Aktiengesellschaft, Berlin and Munich, Fed. Rep. of Germany

[21] Appl. No.: 25,407

[22] Filed: Mar. 13, 1987

[30] Foreign Application Priority Data

Mar. 14, 1986 [DE] Fed. Rep. of Germany ....... 3608601

[51] Int. Cl.⁴ ..................... H03K 11/00; H03K 5/153
[52] U.S. Cl. ..................... 375/4; 178/70 R; 328/164
[58] Field of Search ............... 375/4, 76, 103; 178/70 R, 70 TS; 307/269, 270, 260, 264, 359; 328/164, 162, 165

[56] References Cited

U.S. PATENT DOCUMENTS

| | | | |
|---|---|---|---|
| 2,942,196 | 6/1960 | De Lange | 328/164 |
| 3,424,982 | 1/1969 | Kawashima et al. | 328/164 |
| 3,537,025 | 10/1970 | Baum et al. | |
| 3,593,140 | 7/1971 | Kaneko | 375/4 |
| 3,737,585 | 6/1973 | Ghosh | 375/4 |
| 3,745,257 | 7/1973 | Fudemoto et al. | 375/4 |
| 3,760,111 | 9/1973 | Sawai | 178/170 R |
| 3,986,053 | 10/1976 | Döemer | 375/4 |
| 3,993,952 | 11/1976 | Roza | 375/4 |
| 4,263,555 | 4/1981 | Hunka | 328/162 |
| 4,339,727 | 7/1982 | Kage et al. | 307/359 |
| 4,464,587 | 8/1984 | Suzuki et al. | |
| 4,498,021 | 2/1985 | Uya | 375/4 |
| 4,652,774 | 3/1987 | Hasegawa | 307/359 |
| 4,700,357 | 10/1987 | Ast | 375/4 |

FOREIGN PATENT DOCUMENTS

2324692 11/1974 Fed. Rep. of Germany .
3346725 7/1985 Fed. Rep. of Germany .

OTHER PUBLICATIONS

Arbeitsgeschwindigkeitsgrenzen von Koppelnetzwerken fur Breitband-Digitalsignale by Pfannschmidt 1978 / pp. 78–79.

Primary Examiner—Robert L. Griffin
Assistant Examiner—Marianne Huseman

[57] ABSTRACT

A circuit arrangement for time regeneration of digital signals comprises a correction circuit and a control circuit containing a low-pass filter. For time regeneration of broadband digital signals coded in a DC-free code in broadband digital signal switching and/or transmission systems, a correction element is inserted into the signal path and includes a digital signal input and a control input. The digital signal experiences an increase running time at its signal edges of the one operational sign in the correction element and simultaneously experiences a reduced running time at its signal edges of the other operational sign based on the measure of each DC component occurring in the digital signal. The control circuit comprises a limiter which receives the digital signal and a low-pass filter connected to the limiter and to the control input of the correction element, the control circuit identifying such a DC component.

23 Claims, 4 Drawing Sheets

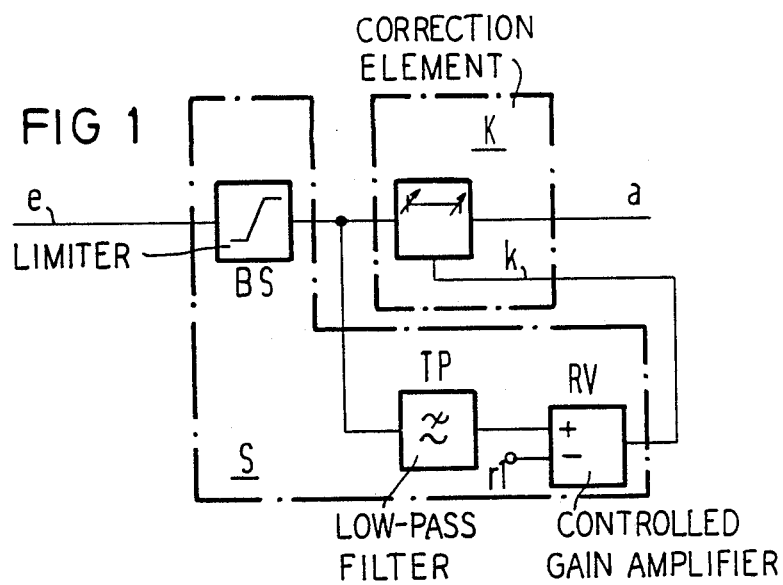

CIRCUIT ARRANGEMENT FOR TIME-REGENERATION OF BROADBAND DIGITAL SIGNALS

BACKGROUND OF THE INVENTION

In broadband digital signals switching and/or transmission systems, running time effects place a limit on the chronological resolution of the switching and/or transmission system and, therefore, on the maximally-allowable bit rate which, in the meantime, can be upwardly shifted by time regeneration of the broadband digital signals. This repetition, under given conditions, in short, three-dimensional spacings is discussed, for example, in the German published application No. 28 36 695 and in the publication Pfannschmidt, "Arbeitsgeschwindigkeitsgrenzen von Zeitvielfach-Raumkoppelnetzwerken fur Breitband-Digitalsignale", dissertation, Braunschweig, 1978, particularly Page 78. Such running time effects thereby stem not only from the short running times per se which are no longer negligible and which add up within the switching and/or transmission system and from running time scatters of integrated circuits, but also stem from the fact that the signal edges experience a shift due to crosstalk phenomena. On the contrary, the chronological resolution is also deteriorated in that, in particular, active circuit elements exhibit different running times for signal edges having differing operational sign. The present invention, proceeding from a coding of the broadband digital signals in a DC-free code, then provides a manner by which how the latter can be countered by a time regeneration which involves only little expense.

SUMMARY OF THE INVENTION

The present invention is directed to a circuit arrangement for time regeneration of digital signals comprising a correction circuit and an appertaining control circuit containing a low-pass filter. This circuit arrangement, according to the present invention, is particularly characterized in that, for time regeneration of broadband digital signals in broadband digital signal switching and/or transmission systems which are coded in a DC-free code, a correction element comprising a digital signal input and a control input is inserted into the signal path. The digital signal experiences an increased running time at its signal edges of the respective one operational sign and experiences a reduced running time at the same time at its signal edges of the respective other operational sign in this correction element, based on the measure of every DC component occurring in the digital signal. A control circuit identifying such a DC component and comprises a limiter circuit charged by the digital signal and a low-pass filter circuit following thereupon leading to the control input of the correction element.

The present invention, which exploits the fact that freedom from direct current with respect to the digital signal to be transmitted is usually desired by way of a corresponding coding, offers the advantage of correction of running time differences of the digital signal edges having differing operational signs than involves little expense and it is particularly effective at the same time and therefore reduces the requirement of more involved time regenerators which are otherwise required.

The known compensation, from the German published application No. 33 46 725, of changes of the pulse duty factor of a phase demodulated data signal, moreover, also requires such a higher expense, in accordance wherewith the data signal, DC decoupled with a high-pass filter, is regenerated by a comparator at whose one input an invariable reference voltage is applied at whose other input a sum signal of the phase demodulated data signal and an auxiliary signal holding the DC mean values thereof constant is supplied, this auxiliary signal being derived in a compensation circuit from the output signal of the comparator forming the compensated data signal by low-pass filtering, integration and inversion.

It should also be mentioned here that it is known in the context of a scanning of a graphics originals and conversion of the scan signal into a digital signal to provide a differentiating network and a high-gain comparator following the differentiating network in the signal path in order to achieve a signal detection of small input signal pulses contained in the background signal which is independent of variations of a background signal and/or of input signal pulse amplitude and/or duration, the output of the comparator being connected to the second input of the first-mentioned differentiating network via a negative feedback path comprising a limiter, a mean value circuit and a further differentiating network which has its second input applied to a reference voltage source (U.S. Pat. No. 4,263,555); no points of closer contact are established within the present invention.

Returning now to the present invention, the limiter circuit can precede the correction element in the signal path in accordance with a further feature of the invention. Alternatively to such a formation of the circuit arrangement of the present invention, as a control arrangement, however, is also possible to construct the circuit arrangement as a regulating arrangement in which the limiter circuit follows the correction element in the digital signal path or in which the limiter circuit and correction element forms a single circuit unit in the digital signal path.

In accordance with a further feature of the invention, the correction element can be simply formed with a threshold circuit having a switching threshold controlled by the control circuit, whereby the shift of the switching threshold effects the desired time regeneration in combination with the finite edge steepness of the broadband digital signal.

A resistor-capacitor (RC) element may often suffice as a low-pass filter circuit in the control circuit.

In accordance with a further feature of the invention, the low-pass filter circuit can be connected to the control input of the correction element via a controlled gain amplifier, whereby the controlled gain amplifier can be designed in view of a proportional (P) or of a proportional-integrated (PI) control characteristic dependent on the requirement of the arrangement.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 1 is a schematic representation of an exemplary embodiment of a control circuit arrangement constructed in accordance with the present invention;

FIG. 2 is a schematic representation of an exemplary embodiment of a regulating circuit constructed in accordance with the present invention;

DESCRIPTION OF THE PREFERRED EMBODIMENTS

Figure 3:
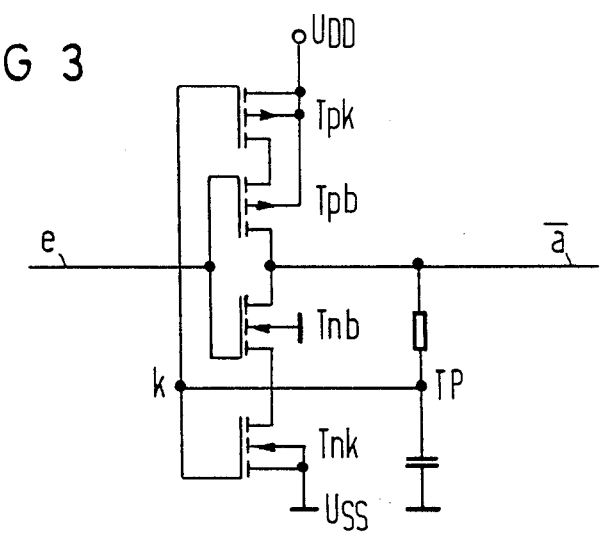
FIG. 3 is a schematic representation of an exemplary embodiment of a regulating circuit constructed in accordance with the present invention.

Referring to FIG. 1, an exemplary embodiment of a circuit arrangement for a time regeneration of broadband digital signals is illustrated as comprising a correction element K inserted into a signal path e-a traversed by a broadband digital signal, the correction element K being preceded in the signal path e-a by a limiter circuit BS of a control circuit S which also comprises a low-pass filter TP leading to a control input k of the correction element K and following the limiter circuit BS charged by the digital signals. A controlled gain amplifier RV having differential inputs + and − whose input (−) can be assumed to be charged with a reference signal r1 is inserted between the low pass filter TP and the correction element k in the exemplary embodiment of FIG. 1.

As a result of a coding of the broadband digital signal in a DC-free code, the two signal states "high" and "low" occur for equal lengths in the broadband digital signal as seen statistically (i.e. over an adequately-long time). The circuit arrangement of the present invention exploits this characteristic in order to at least partially eliminate signal distortions caused by different running times of digital signal edges having differing operational signs. When the pulse duty factor of the broadband digital signal appearing at the signal path input e or, respectively, stated more precisely, of the digital signal amplitude-limited in the limiter circuit BS deviates from the ratio 1:1, i.e. when the signal state "high" appears for a longer (or, respectively, shorter time) than the signal state "low" as seen over an adequately-long time, then a corresponding modification of the output signal of the low-pass filter TP and, therefore, of the control signal supplied to the control input k of the correction element K via the controlled gain amplifier RV arises, on the basis of which the leading digital signal edges experience an increased (or, respectively, reduced) running time in the correction element K and the trailing digital signal edges experience a reduced (or, respectively, increase) running time in the correction element K. The deviation of the pulse duty factor from the value 1:1 can therefore be largely eliminated for the broadband digital signal appearing at the signal path output a.

How the correction element K and the limiter BS can be realized in detail may be seen from the further exemplary embodiment of a circuit arrangement for time regeneration of broadband digital signals in accordance with the present invention illustrated in FIG. 2. According to FIG. 2, the correction element K is formed with a threshold circuit KS having a switching threshold controlled by the control circuit S, in particular, comprising a switching transistor Tk in gate circuitry inserted into the digital signal path e-a to whose gate electrode the control circuit S is connected and which has its output connected at a feed voltage source $U_{DD}$ (for example, +5V) via a load transistor T1. In the exemplary embodiment of FIG. 2, the switching transistor Tk is thereby an n-channel enhancement field effect transistor and the load transistor T1, forming a current source circuit together with the feed voltage source $U_{DD}$, is a p-channel enhancement field effect transistor.

The limiter BS is formed with a complementary-metal-oxide semiconductor (CMOS) inverter circuit comprising two transistors Tpb and Tnb. As further indicated in FIG. 2, the low-pass filter TP can be formed with a simple RC element. Since, as illustrated in FIG. 2, the low-pass filter TP is connected to the output a of the inverter-circuit Tpb, Tnb, the digital signal inversion effected is taken into consideration, in particular, in that the inputs of the controlled gain amplifier RV, again inserted between the low-pass filter TP and the correction element control input k, are interchanged with one another in FIG. 2 in comparison to the conditions illustrated in FIG. 1.

In the exemplary embodiment of FIG. 2, moreover, the control circuit S follows in the digital path e-a, departing from the conditions of the correction element K illustrated in FIG. 1. Instead of the control arrangement of FIG. 1, one therefore obtains a regulating arrangement in accordance with FIG. 2 comprising the possibility inherent in such an arrangement of being able to arbitrarily precisely correct deviations of the pulse duty factor from its reference value by way of a corresponding connection of the controlled gain amplifier RV.

In the time regeneration circuit of FIG. 2, it is assumed that a potential of, for example, about −1V prevails at the signal path input e, and, therefore, at the digital signal input of the correction element K in the digital signal state "high" and a potential of, for example, about −2V prevails at the digital signal state "low", whereby the two voltage states should statistically appear for identical lengths, i.e. as seen over an adequately-long time, due to a coding of the broadband digital signal in a DC-free code. Thereby, let it be assumed that a control potential of, for example, about +0.4V proceeding from the control circuit S be applied to the control input k of the correction element K and, therefore, at the gate electrode of the switching transistor Tk of the threshold circuit KS, whereby the switching threshold of the switching transistor Tk connected to the load transistor T1 may be assumed to lie therebelow by a threshold voltage of, for example, about −1.8V. Given the signal state "high", the switching transistor Tk in the threshold circuit KS is then non-conductive and a potential of about +3.3V in the present example then arises at the input of the following limiter circuit BS whose switching threshold can be assumed to lie at about +1V, the p-channel transistor Tpb of the CMOS inverter BS being non-conductive (or at most very weakly conductive) due to this potential and the n-channel transistor Tnb being highly conductive. Given the digital state "low", the switching transistor Tk and the threshold circuit KS is conductive and a potential of about −1.2V in the present example arises at the input of the following limiter BS, the p-channel transistor Tpb of the CMOS inverter being conductive due to this potential and the n-channel transistor Tnb being non-conductive. By way of the low-pass filter TP, the chronological mean value of the digital signal appearing at the limiter output proceeds to the input (−) of the differential amplifier RV whose other input (+) can be assumed to be charged with the reference signals r2 and from whose output it can be assumed that the control potential of +0.4V in the present example is output given a pulse duty factor 1:1 observed by the broadband digital signal.

When the pulse duty factor of the broadband digital signal deviates from the factor 1:1, i.e. when the signal state "high" occurs for a longer (or, respectively, shorter) time than the signal state "low" as seen over an adequately-long time, and, consequently, to signal state "low" appears for a longer (or, respectively, shorter) time than the signal state "high" at the inverter output $\bar{a}$, then a corresponding decrease (or, respectively, increase) of the output signal of the low-pass filter TP arises as does, therefore, a corresponding increase (or, respectively, decrease) in the input signal difference at the controlled gain amplifier RV. This causes a corresponding increase (or, respectively, decrease) in the potential supplied from the output of the controlled gain amplifier RV to the control input k of the correction element K of, for example, 0.2V, with the result that, accordingly, the switching threshold of the CMOS threshold circuit KS is increased (or, respectively, decreased). The leading digital signal edges therefore cross the switching threshold later or, respectively, earlier and, therefore, experience an increase (or, respectively, decrease) running time and the trailing digital signal edges fall below the switching threshold earlier (or, respectively, later) and, therefore, experience a reduced or, respectively, increased) running time. Each deviation of the pulse duty factor from the reference value 1:1 can, therefore be eliminated for the broadband digital signal appearing at the signal path output $\bar{a}$ in FIG. 2. As warranted, however, yet another inverter circuit can be followed here in order to, in turn, cancel the inversion of the broadband digital signal effective in the limiter BS of FIG. 2.

FIG. 3 illustrates an exemplary embodiment of a circuit arrangement constructed in accordance with the present invention in which the correction element is again formed with a threshold circuit comprising a switching threshold controlled by a control circuit and the control circuit again comprises a limiter charged by the digital signal and comprises a low-pass filter TP following the limiter, whereby the limiter and the correction element now form a single circuit unit in the digital signal path. The limiter is again an inverter circuit Tpb, Tnb realized in CMOS technology. A further p-channel transistor Tpk is inserted between the p-channel transistor Tpb and the appertaining feed voltage source $U_{DD}$ and a further n-channel transistor Tnk is inserted between the n-channel transistor Tnb and the appertaining voltage source $U_{SS}$. At their control electrodes, these two further CMOS transistors Tpk and Tnk are controlled proceeding from $\bar{a}$ low-pass filter TP, again formed with an RC element in accordance with FIG. 3. The signal path output is referenced a in FIG. 3, wherewith the inversion of the time regenerated broadband digital signal effected in the inverter circuit Tpb, Tnb can be taken into consideration. As warranted, however, another inverter circuit can also be additionally inserted here in order to again cancel the inversion of the broadband digital signals.

When the pulse duty factor of the broadband digital signal appearing at the signal path input e deviates from the ratio 1:1, i.e. when the signal state "high" occurs for a longer (or, respectively, shorter) time than the signal state "low" as seen over an adequately-long time, then a corresponding decrease (or, respectively, increase) of the output signal of the low-pass filter Tp and, therefore, of the control potential supplied via the control input k to the two further CMOS transistors Tpk and Tnk arises, on the basis whereof the channel formation is facilitated (or, respectively, made more difficult) in the p-channel transistor Tpk and the channel formation is made more difficult (or, respectively, facilitated) in the n-channel transistor Tnk, with the result that the switching threshold of the CMOS inverter circuit Tpb, Tnb is increased (or, respectively, decreased) accordingly. The digital signal leading edges therefore cross a switching threshold later (or, respectively, earlier) and therefore experience a increased (reduced) running time and the digital signal trailing edges fall below the switching threshold earlier (or, respectively, later) and therefore experience a decreased (or, respectively, increased) running time.

Figure 4:
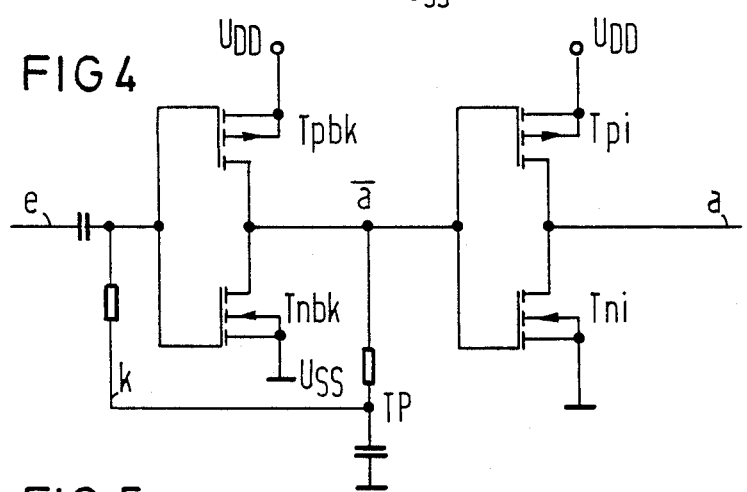
FIG. 4 is a schematic representation of an exemplary embodiment of a regulating circuit constructed in accordance with the present invention.

FIG. 4 illustrates a further exemplary embodiment of the circuit arrangement for time regeneration constructed in accordance with the present invention and comprising a correction circuit and limiter constructed as a single circuit unit in the digital signal path e-a. In accordance with FIG. 4, a CMOS inverter Tpbk, Tnbk inserted in the signal path e-a is capacitively coupled to the input e for receiving the digital signal which is to be chronologically generated. At the same time, the inverter input is electrically charged with a switching threshold controlled voltage by way of a low-pass filter TP, formed as an RC element in accordance with FIG. 4, whereby the low-pass filter TP is, in turn, charged with the inverted, time regenerated digital signal. Yet another CMOS inverter Tpi, Tni is inserted into the actual digital signal e-a following the output $\bar{a}$ of the CMOS inverter Tpbk, Tnbk which is directly connected to the input of the low-pass filter TP for this purpose, this being done in order to cancel the inversion of the broadband digital signal effected in the correction and limiter circuit Tpbk, Tnbk. As was already set forth above, such an additional inverter Tpi, Tni can also be provided in the circuit arrangements of FIGS. 2 and 3. When, in the circuit arrangement of FIG. 4, the pulse duty factor of the broadband digital signal appearing at the signal path input e deviates from the ratio 1:1 and when the signal state "high" appears for a longer (or, respectively, shorter) time than the signal state "low" as seen over an adequately-long time, then a corresponding decrease (or, respectively, increase) in the output signal of the low-pass filter TP and, therefore, in the bias electrically supplied via the control input k to the inverter circuit Tpbk, Tnbk arises, with the result of a corresponding displacement of the broadband digital signal which is to be time regenerated and which is effective at the control electrode of the two transistors Tpbk and Tnbk. The digital signal leading edges therefore exceed the switching threshold later (or, respectively, earlier) and therefore experience an increased (or, respectively, decreased) running time and the digital signal trailing edges fall below the switching threshold earlier (or, respectively, later) and therefore experience a decreased (or, respectively, increased) running time.

Just as in the circuit arrangement of FIG. 3, the signal emitted at the output by the low-pass filter TP is directly supplied to the control input k in the circuit arrangement of FIG. 4, i.e. foregoing a controlled gain amplifier. The elimination of a controlled gain amplifier occurs that only a P-controlled characteristic is possible, the effect thereof to be weakly dimensioned in favor of the stability of the control circuit.

Figure 5:
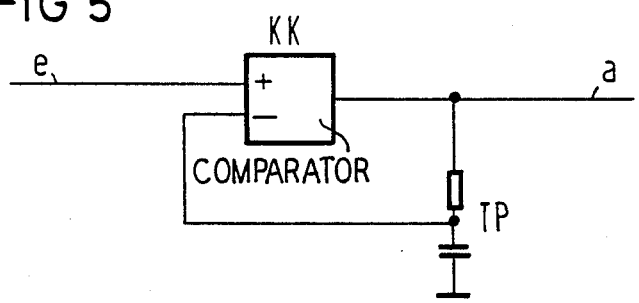
FIG. 5 is a schematic representation of another exemplary embodiment of a regulating circuit constructed in accordance with the present invention.
Figure 6A:
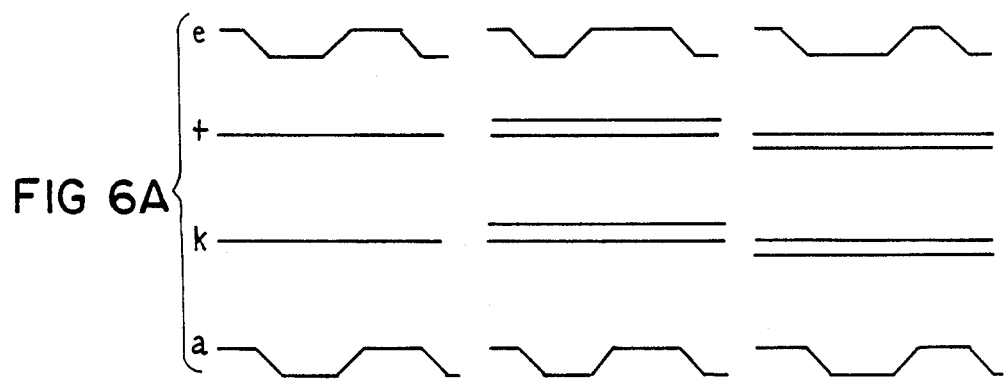
FIGS. 6A–6E are timming diagrams of signals in embodiments of FIGS. 1–5.
Figure 6B:
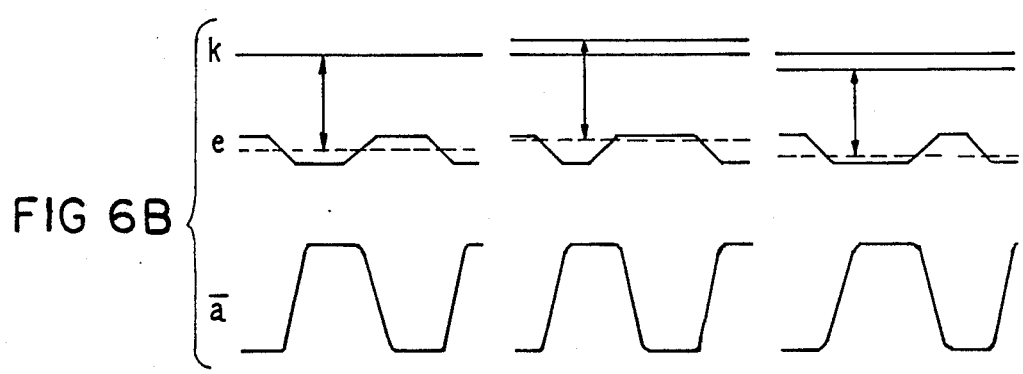
Figure 6C:
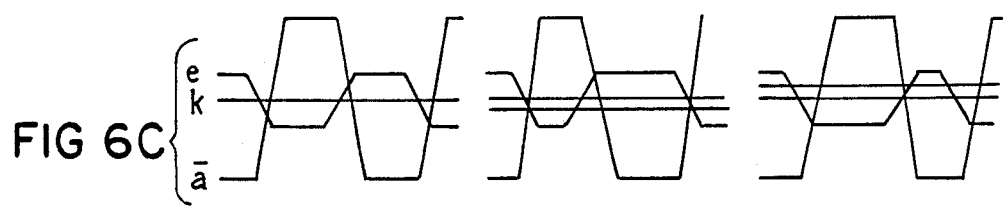
Figure 6D:
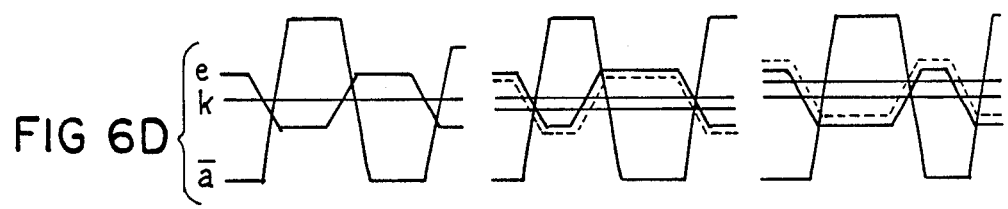
Figure 6E:
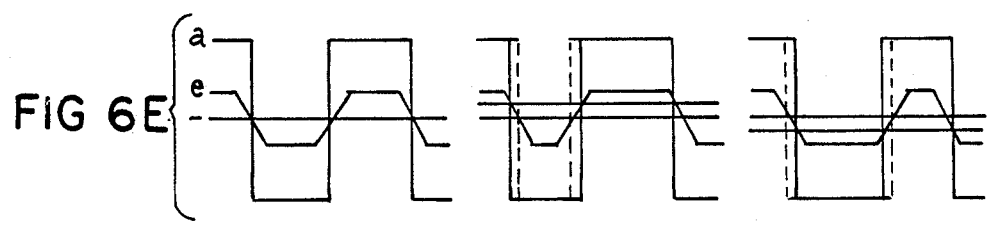

FIG. 5 illustrates a further exemplary embodiment of the present invention for a circuit arrangement for time regeneration of broadband digital signals which likewise foregoes a controlled gain amplifier. Here, the correction element is formed with a comparator KK which is inserted into the digital signal path e-a and to whose reference input (−) a low-pass filter TP formed by an RC element and charged with the output signal of the comparator KK leads. For example, the comparator can be formed with a simple emitter coupled logic (ECL) element which, as known, has the appearance of a differential amplifier at its input side, whereby the relatively high sensitivity established in ECL elements simultaneously provides the required limiter function.

When, in the circuit arrangement of FIG. 5, the digital signal state "high" appears at the signal path input a for a longer (or, respectively, shorter) time than the signal state "low", as seen over an adequately-long time, a corresponding increase (or, respectively, decrease) in the output signal of the low-pass filter TP and, therefore, in the reference signal supplied to the reference input (−) of the comparator KK as well appears. This effects a corresponding raising (or, respectively, lowering) of the comparator threshold which is therefore exceeded later (or, respectively, earlier) by the digital signal leading edges and is fallen below earlier (or, respectively, later) by the digital signal trailing edges, wherewith the digital signal leading edges experience an increased (or, respectively decrease) running time and the digital signal trailing edges experience a decreased (or, respectively, increased running time.

FIGS. 6A-6E are timing diagrams of signals which appear in the embodiment of FIGS. 1-5. These timing diagrams contain signal curves for a pulse duty factor of the input signal 2 of about 1:1 (left), of about 1:2 (center) and of about 2:1 (right), whereby the reference symbols entered on the left margin show clearly at which circuit points the corresponding signal curves occur. A general rule is that the time regeneration is more exact when the signal edges of the input signal are less steep and that at that point where no AGC control amplifier is used, and a certain control error must remain, as this can be seen in the illustrated signal curves. It is difficult to fully illustrate the functioning of the control circuit since dynamic events are involved. Therefore, it is indicated by dashed lines in the timing diagram corresponding FIG. 5, for the type of curve the output signal would have for an open control loop. In the timing diagram for FIG. 4 it is indicated by a dotted line wherein for the embodiment illustrated in FIG. 4 the correction signal is input signal E.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A circuit arrangement for time regeneration of digital signals, comprising:

a correction element for time regeneration of broadband signals coded in a DC-free code, comprising a digital signal input and a control input in a signal path;

the digital signal experiencing an increased running time at its signal edges of one operational sign in said correction element and simultaneously experiencing a reduced running time at its signal edges of the respectively other operational sign based on a measure of each DC component occurring in the digital signal;

a control circuit including a limiter for receiving the digital signal and a low-pass filter connected to said correction element and limiter, said correction element and said control circuit identifying said DC components, and means for connecting an output of said low-pass filter to said control input.

2. The circuit arrangement of claim 1, wherein: said limiter follows said correction element in the digital signal path.

3. The circuit arrangement of claim 1, wherein: said low-pass filter comprises a resistor-capacitor combination.

4. The circuit arrangement of claim 1, wherein: said low-pass filter is connected to said control input of said correction element by way of a controlled-gain amplifier.

5. The circuit arrangement of claim 4, wherein: said controlled-gain amplifier is a differential amplifier connected to a reference potential at a reference input.

6. A circuit arrangement for the time regeneration of digital signals, comprising:

a correction element for time regeneration of broadband signals coded in a DC-free code, comprising a digital signal input and a control input in a signal path;

the digital signal experiencing an increased running time at its signal edges of one operational sign in said correction element and simultaneously experiencing a reduced running time at its signal edges of the respectively other operational sign based on a measure of each DC component occurring in the digital signal;

a control circuit including a limiter for receiving the digital signal and a low-pass filter connected to said correction element and limiter, said correction element and said control circuit identifying said DC components, and means for connecting an output of said low-pass filter to said control input, said limiter preceding said correction element in the digital signal path.

7. The circuit arrangement of claim 6, wherein said low-pass filter comprises a resistor-capacitor combination.

8. The circuit arrangement of claim 6, wherein said low-pass filter is connected to said control input of said correction element by way of a controlled-gain amplifier.

9. The circuit arrangement of claim 8, wherein said controlled-gain amplifier is a differential amplifier connected to a reference potential at a reference input.

10. A circuit arrangement for time regeneration of digital signals, comprising:

a correction element for time regeneration of broadline signals coded in a DC-free code, comprising a digital signal input and a control input in a signal path;

the digital signal experiencing an increased running time at its signal edges of one operational sign in said correction element and simultaneously experiencing a reduced running time at its signal edges of the respectively other operational sign based on a measure of each DC component occurring in the digital signal;

a control circuit including a limiter for receiving the digital signal and a low-pass filter connected to said correction element and limiter, said correction element and said control circuit identifying said DC components, and means for connecting an output of said low-pass filter to said control input, said limiter and said correction element forming a single circuit unit in the digital signal path.

11. The circuit arrangement of claim 10, wherein:
said correction element is formed with a comparator including a reference input, said low-pass filter connected to the output of said comparator.

12. The circuit arrangement of claim 10, wherein said low-pass filter comprises a resistor-capacitor combination.

13. The circuit arrangement of claim 10, wherein said low-pass filter is connected to said control input of said correction element by way of a controlled-gain amplifier.

14. The circuit arrangement of claim 13, wherein said controlled-gain amplifier is a differential amplifier connected to a reference potential at a reference input.

15. The circuit arrangement according to claim 10, wherein said limiter includes an inverter and said inverter includes an input connected into the signal path an is capacitatively charged with the supplied digital signal which is to be time regenerated and, at the same time, is electrically connected with a switching threshold control voltage from said low-pass filter which is, in turn, connected with the inverted, time regenerated digital signal.

16. The circuit arrangement of claim 10, wherein said limiter includes an inverter and said inverter comprises a complementary metal oxide semiconductor inverter having first and second metal oxide semiconductor transistors of first and second channel types, respectively, and including a further metal oxide semiconductor transistor of said first channel type connected between said first transistor and a feed voltage source, and a further metal oxide semiconductor transistor of said second channel type connected between said second transistor and a feed voltage source, and means for connecting the control electrodes of both said further transistors to said low-pass filter.

17. The circuit arrangement of claim 16, wherein said inverter includes an output which is connected to the control electrodes of said two further metal-oxide-semiconductor transistors by way of said resistor-capacitor combination.

18. A circuit arrangement for time regeneration of digital signals, comprising:
a correction element for time regeneration of broadband signals coded in a DC-free code, comprising a digital signal input and a control input in a signal path;
the digital signal experiencing an increased running time at its signal edges of one operational sign in said correction element and simultaneously experiencing a reduced running time at its signal edges of the respectively other operational sign based on a measure of each DC component occurring in the digital signal;
a control circuit including a limiter for receiving the digital signal and a low-pass filter connected to said correction element and limiter, said correction element and said control circuit identifying said DC components, and means for connecting an output of said low-pass filter to said control input, said limiter including an inverter.

19. The circuit arrangement according to claim 18, wherein:
said inverter includes an input connected into the signal path and is capacitively charged with the supplied digital signal which is to be time regenerated and, at the same time, is electrically connected with a switching threshold control voltage from said low-pass filter which is, in turn, connected with the inverted, time regenerated digital signal.

20. The circuit arrangement of claim 18, wherein said inverter comprises a complementary metal oxide semiconductor inverter having first and second metal oxide semiconductor transistors of first and second channel types, respectively, and including a further metal oxide semiconductor transistor of said first channel type connected between said first transistor and a feed voltage source, and a further metal oxide semiconductor transistor of said second channel type connected between said second transistor and a feed voltage source, and means for connecting the control electrodes of both said further transistors to said low-pass filter.

21. The circuit arrangement of claim 20, wherein:
said inverter includes an output which is connected to the control electrodes of said two further metal-oxide-semiconductor transistors by way of said resistor-capacitor combination.

22. A circuit arrangement for time regeneration of digital signals, comprising:
a correction element for time regeneration of broadband signals coded in a DC-free code, comprising a digital signal input and a control input in a signal path;
the digital signal experiencing an increased running time at its signal edges of one operational sign in said correction element and simultaneously experiencing a reduced running time at its signal edges of the respectively other operational sign based on a measure of each DC component occurring in the digital signal;
a control circuit including a limiter for receiving the digital signal and a low-pass filter connected to said correction element and limiter, said correction element and said control circuit identifying said DC components, and means for connecting an output of said low-pass filter to said control input, said correction element having a threshold circuit including a switching threshold controlled by said control circuit.

23. The circuit arrangement according to claim 22, wherein:
said correction element comprises a switching transistor constructed in gate circuitry which is inserted into the digital signal path and is connected to a load transistor, the control circuit connected to the gate electrode of the switching transistor.

* * * * *